US012592360B2

(12) United States Patent
Morita et al.

(10) Patent No.:  US 12,592,360 B2
(45) Date of Patent:      Mar. 31, 2026

(54) MULTI CHARGED PARTICLE BEAM WRITING METHOD AND MULTI CHARGED PARTICLE BEAM WRITING APPARATUS

(71) Applicant: NuFlare Technology, Inc., Yokohama (JP)

(72) Inventors: Hirofumi Morita, Setagaya-ku (JP); Takanao Touya, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 619 days.

(21) Appl. No.: 17/819,048

(22) Filed: Aug. 11, 2022

(65) Prior Publication Data

US 2023/0055778 A1      Feb. 23, 2023

(30) Foreign Application Priority Data

Aug. 23, 2021    (JP) ................................. 2021-135680
May 30, 2022    (JP) ................................. 2022-087811

(51) Int. Cl.
H01J 37/147        (2006.01)
H01J 37/317        (2006.01)

(52) U.S. Cl.
CPC ...... H01J 37/3177 (2013.01); H01J 37/1472 (2013.01); *H01J 2237/0437* (2013.01); *H01J 2237/15* (2013.01)

(58) Field of Classification Search
None
See application file for complete search history.

(56) References Cited

U.S. PATENT DOCUMENTS 3,956,635 A  *  5/1976  Chang ..................... H01L 21/00
                                                              430/296
8,637,820 B2      1/2014  Sohda et al.
8,927,941 B2      1/2015  Touya et al.
(Continued)

FOREIGN PATENT DOCUMENTS

CN           1452014 A      10/2003
CN        109300759 A        2/2019
(Continued)

OTHER PUBLICATIONS

Korean Office Action issued on Aug. 9, 2024 in Korean Patent Application No. 10-2022-0086381 (with unedited computer-generated English translation), 14 pages.
(Continued)

*Primary Examiner* — James Choi
(74) *Attorney, Agent, or Firm* — Oblon, McClelland, Maier & Neustadt, L.L.P.

(57)            ABSTRACT

In one embodiment, a multi charged particle beam writing method includes forming a multi charged particle beam with which a substrate serving as a writing target is irradiated, deflecting the multi charged particle beam to a position with a predetermined deflection offset added so that deflection voltages respectively applied to a plurality of electrodes of an electrostatic positioning deflector does not include a state where all the deflection voltages are zero, and irradiating the substrate with the multi charged particle beam. A positive common voltage is added to the deflection voltages which are applied to the respective electrodes of the electrostatic positioning deflector.

12 Claims, 7 Drawing Sheets

(56) References Cited

U.S. PATENT DOCUMENTS

| | | | | |
|---|---|---|---|---|
| 9,373,424 | B2 | 6/2016 | Touya et al. | |
| 10,451,976 | B2 | 10/2019 | Ogasawara | |
| 10,998,164 | B2 | 5/2021 | Touya et al. | |
| 2014/0175303 | A1* | 6/2014 | Touya .................. | H01J 37/141 |
| | | | | 250/398 |
| 2017/0352520 | A1* | 12/2017 | Matsumoto ......... | H01J 37/1471 |
| 2022/0328278 | A1* | 10/2022 | Morita .................. | H01J 37/147 |

FOREIGN PATENT DOCUMENTS

| | | | |
|---|---|---|---|
| CN | 110571116 | A | 12/2019 |
| JP | 61-101944 | A | 5/1986 |
| JP | 2000-268755 | A | 9/2000 |
| JP | 2002-93357 | A | 3/2002 |
| JP | 2002-117796 | A | 4/2002 |
| JP | WO2011/108368 | A1 | 9/2011 |
| JP | 2013-191841 | A | 9/2013 |
| JP | 2013-197289 | A | 9/2013 |
| JP | 2014-194982 | A | 10/2014 |
| JP | 2017-112263 | A | 6/2017 |
| JP | 2018-170435 | A | 11/2018 |
| JP | 2019-071354 | A | 5/2019 |
| JP | 2019-212766 | A | 12/2019 |
| WO | WO 2020/183551 | A1 | 9/2020 |

OTHER PUBLICATIONS

Morita et al., "Basic Characteristics of Beam Position Drift and Field Stitching Error Caused by Electron Beam col. Charging", Japanese Journal of Applied Physics, vol. 35, Part 1, No. 7, Jul. 1996, pp. 4121-4127.

Kato et al., "Beam position stabilization by suppression of electrons reentering the electron-beam column", Journal of Vacuum Science & Technology B 13(6), Nov./Dec. 1995, pp. 2450-2454.

Combined Chinese Office Action and Search Report issued Jan. 8, 2026 in Chinese Patent Application No. 202211011589.6 (with English translation of Office Action only), 12 pages.

* cited by examiner

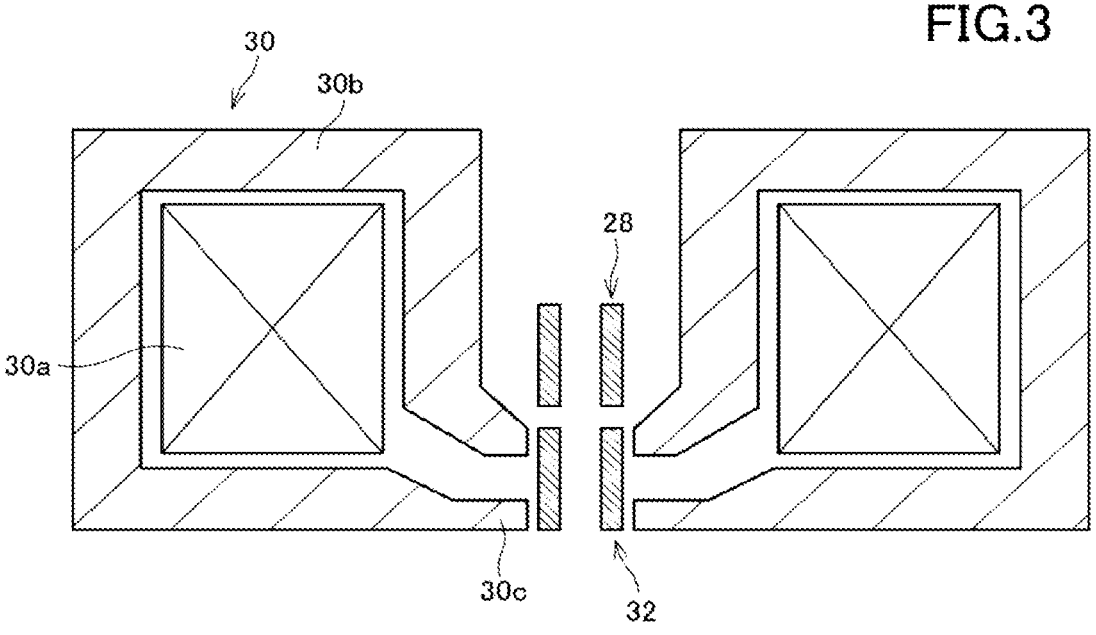

FIG.6A
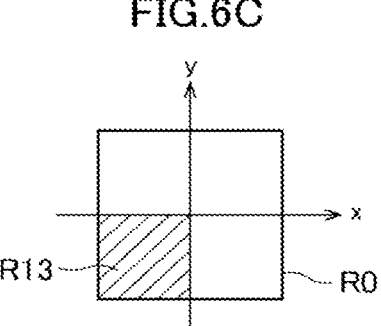
FIG.6B
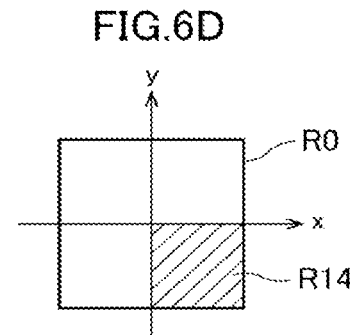
FIG.6C
FIG.6D
FIG.7
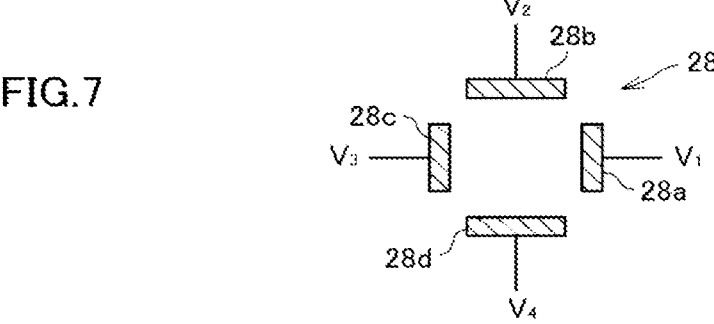

FIG.8A
FIG.8B
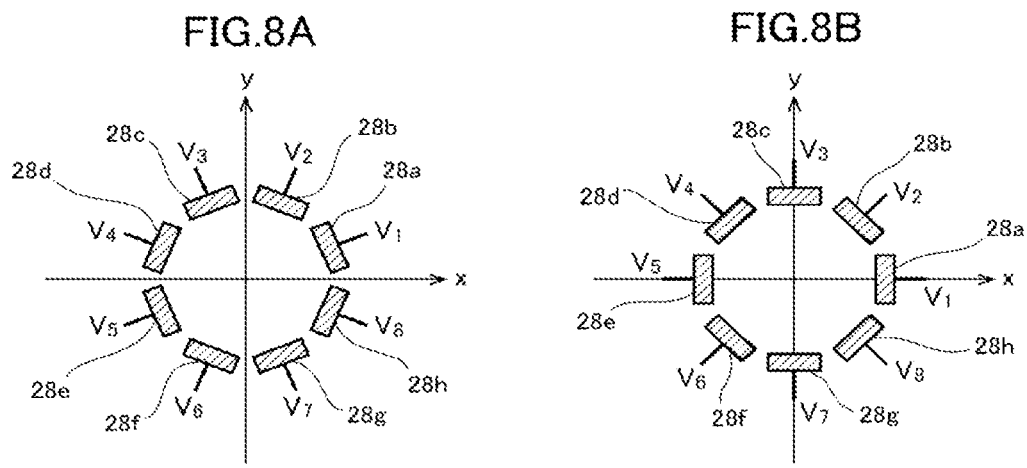
FIG.9A
FIG.9B
FIG.9C
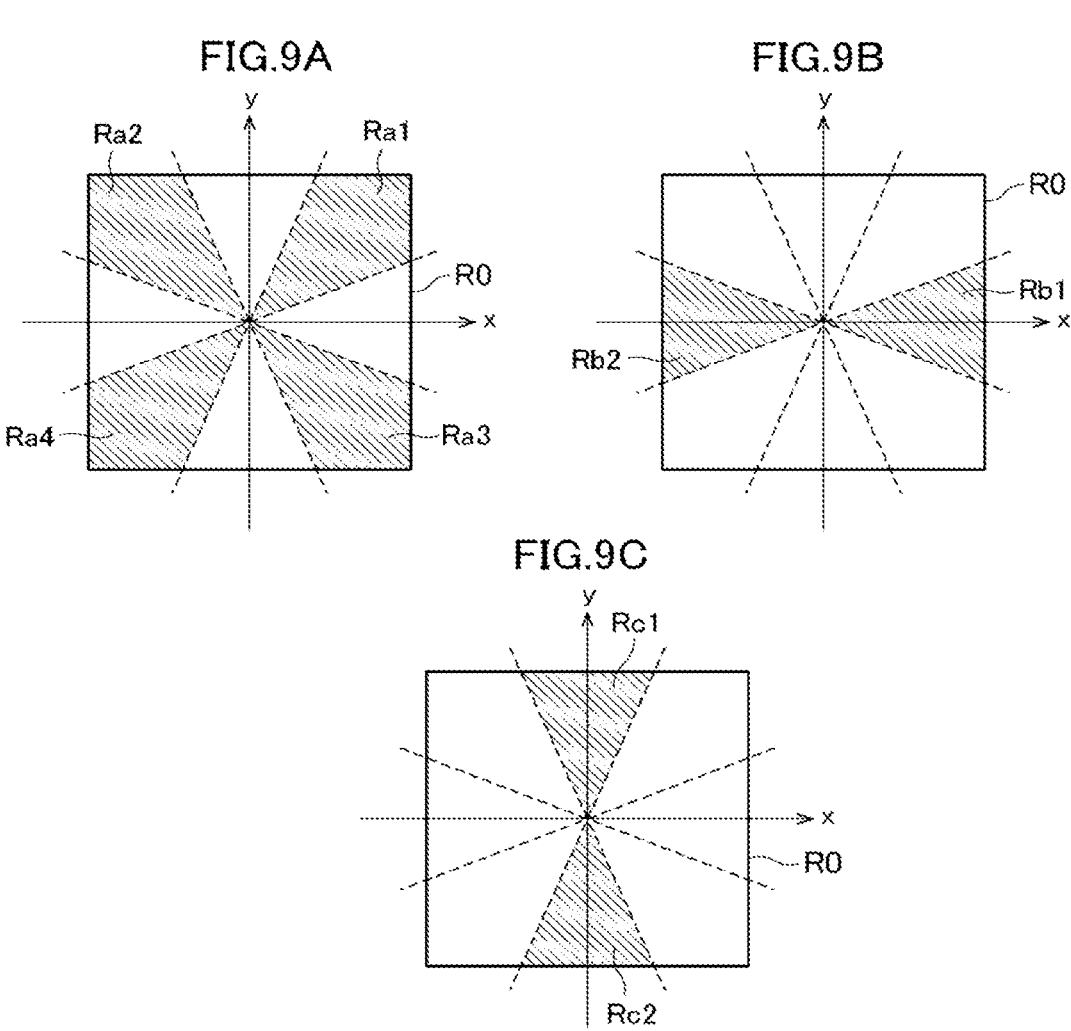

FIG.10A
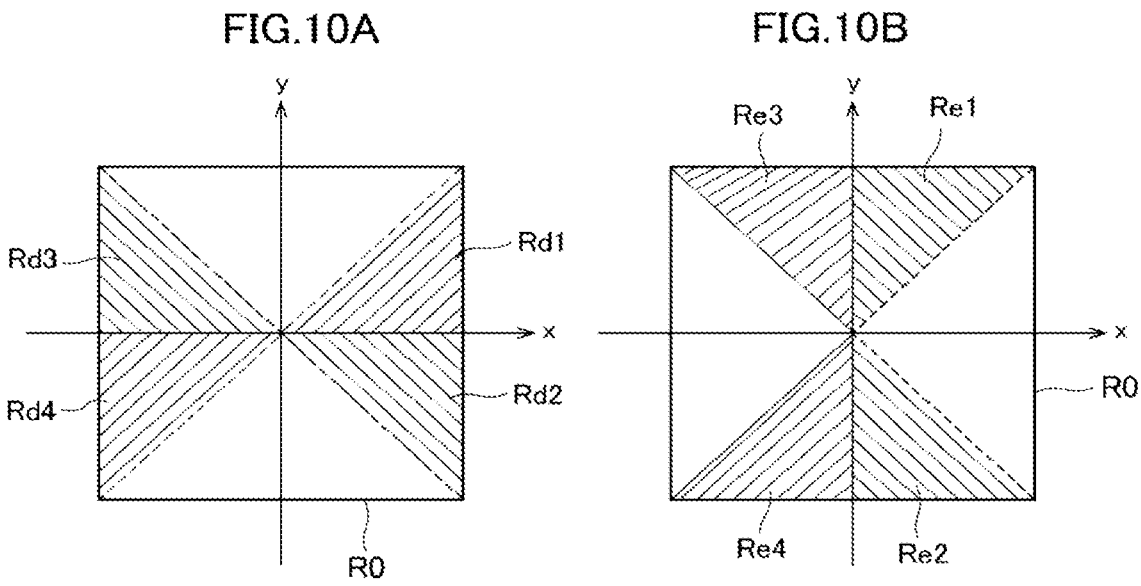
FIG.10B
FIG.11
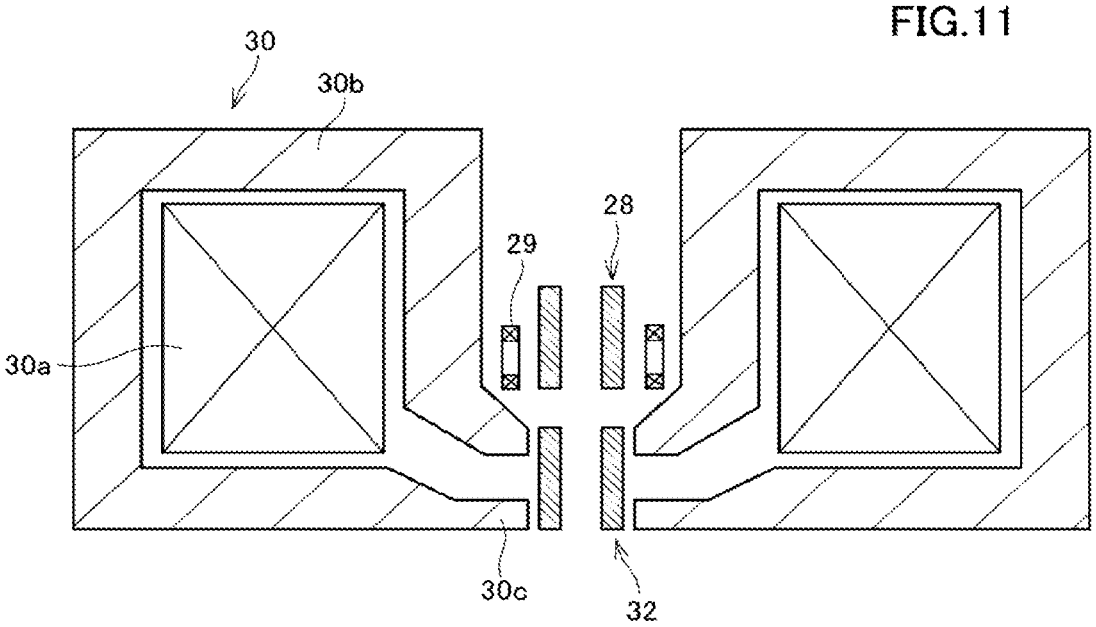

FIG.12A
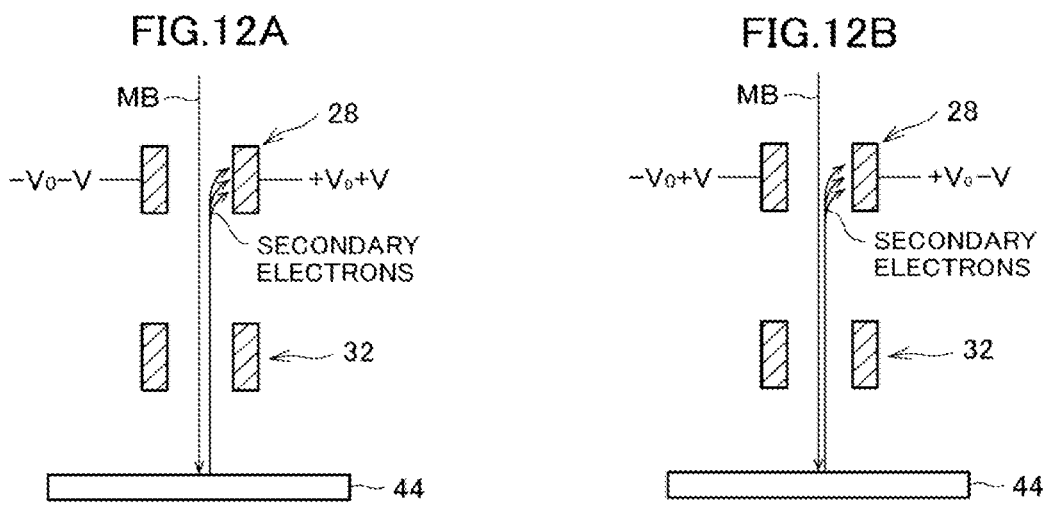
FIG.12B
FIG.13
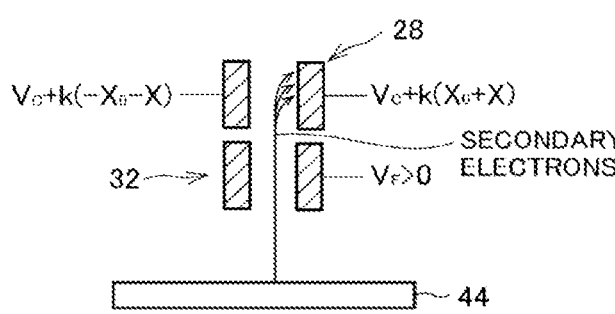
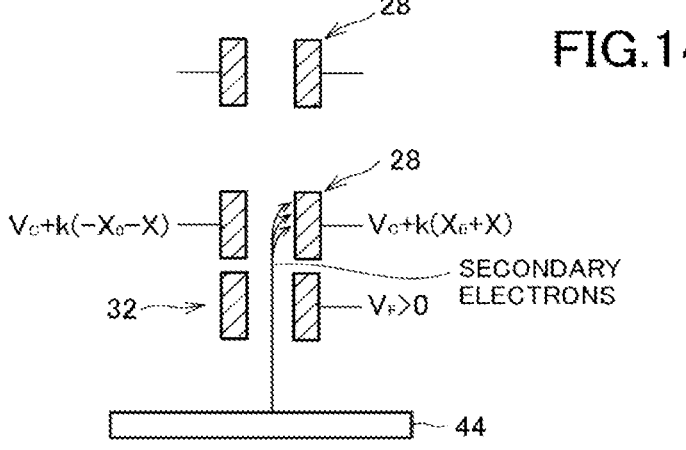
FIG.14

MULTI CHARGED PARTICLE BEAM WRITING METHOD AND MULTI CHARGED PARTICLE BEAM WRITING APPARATUS

CROSS REFERENCE TO RELATED APPLICATION

This application is based upon and claims benefit of priority from the Japanese Patent Application No. 2021-135680, filed on Aug. 23, 2021, and the Japanese Patent Application No. 2022-87811, filed on May 30, 2022, the entire contents of which are incorporated herein by reference.

FIELD

The present invention relates to a multi charged particle beam writing method and a multi charged particle beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

As a form of electron beam writing apparatus, a multi-electron beam writing apparatus that uses a multi-beam is known. A multi-beam electron beam writing apparatus can irradiate with many beams at one time, as compared to a writing apparatus that performs writing with a single electron beam, thus the throughput can be significantly improved. In the multi-electron beam writing apparatus, the beam of each shot is focused by an objective lens on the substrate surface which is a writing target, and focus correction (dynamic focusing) is dynamically performed during writing using electrostatic lenses to cope with the irregularities on the substrate surface. When the electrostatic lenses are operated in a negative voltage range, secondary electrons generated by electron beam writing return to the substrate surface, thus the resist is electrically charged, which prevents the improvement of the position accuracy of a writing pattern.

In order to reduce the effect of returning of the secondary electrons, it is preferable to operate the electrostatic lenses in a positive voltage range with respect to the substrate surface, and to guide the secondary electrons upward from the substrate surface.

However, when the electrostatic lenses are operated in a positive voltage range, a problem arises in that after passing through the electrostatic lenses, the secondary electrons from the substrate surface suddenly decelerate and stay in high density on the beam trajectory, or cause non-conductive contamination on the inner surface of the electrode of a deflector to be electrically charged, thus the electric field near the electron beam is changed to alter the trajectory of the electron beam, and the beam position accuracy is deteriorated.

In Non-Patent Literature 1 (Hirofumi Morita, Junichi Kato and Nobuo Shimazu, Basic characteristics of beam position drift and field stitching error caused by electron beam column charging, Japanese Journal of Applied Physics Vol. 35 (1996), Part 1, No. 7, July 1996, pp. 4121-4127) which is a research reporting drift (beam position instability or beam position variation) influenced by electric charge of electrodes of a deflector, a phenomenon is described in which drift is reduced by performing deflection in a narrow region centered on an end point where deflection (deflection offset) is performed. However, in a variable shaping beam writing apparatus which is an experimental target in Non-Patent Literature 1 and has been widely used in the industry, the writing throughput is significantly affected by the dimensions of the deflection region (deflection field) utilized in writing, and when writing is performed only on a narrow region centered on an end point where deflection is performed, a problem arises in that the throughput is dramatically reduced. For this reason, it is extremely difficult to practically utilize the phenomenon described in Non-Patent Literature 1, that is, drift is reduced by performing deflection in a narrow region centered on an end point where deflection is performed, thus the phenomenon has never been actually used in the industry.

Unlike the variable shaping beam apparatus, in the multi-beam writing apparatus, even with small dimensions of the deflection region, the risk of reduction in the throughput is very little, thus there is a possibility of utilizing the above-mentioned phenomenon.

However, performing deflection (deflection offset) for reduction of drift causes a new problem that array distortion (displacement from ideal positions among individual beams) increases. Reduction in the array distortion is a required challenge which has newly occurred in a multi-beam optical system. Unlike the variable shaping beam optical system that forms a small beam, approximately 1 μm or less, the multi-beam optical system forms an array beam having very large dimensions, for example, approximately 100 μm in length and width, thus the array distortion is likely to increase, and reduction in the array distortion is very difficult and important in design. When deflection offset for reduction of drift is applied, the array distortion caused by deflection increases, and the writing accuracy is deteriorated.

It is known that in order to reduce the array distortion caused by deflection, a configuration (so-called an in-lens arrangement) is effective in which deflectors are arranged in a lens magnetic field. In order to reduce the array distortion caused by deflection, deflectors are often disposed in multiple stages to optimize the amount of deflection and the direction of deflection of each deflector; however, for large reduction in distortion required for multi-beam writing apparatus, it is practically necessary to arrange one deflector in a lens magnetic field (in-lens arrangement) as a precondition for optimization. Meanwhile, in order to obtain practically sufficient correction sensitivity (focus correction sensitivity and rotation correction sensitivity), it is indispensable that an electrostatic correction lens be disposed (similarly, in-lens arrangement) in the lens magnetic field (see Japanese Unexamined Patent Application Publication No. S61-101944 and Japanese Unexamined Patent Application Publication No. 2013-197289). As a result, the correction lens needs to be disposed near the center of the magnetic pole piece, and the deflector needs to be in the vicinity immediately above the correction lens and to be disposed where the lens magnetic field is present.

However, when the deflector is brought close to the electrostatic correction lens, a new problem arises in that the secondary electrons from the sample surface pass through the correction lens, then decelerate and stay at the entrance to the deflector, which causes instability (drift) of the beam (primary beam). As a countermeasure technique to the drift due to stay of the secondary electrons caused by their deceleration, Japanese Unexamined Patent Application Publication No. 2018-170435 discloses a technique to dispose an electrode with a positive voltage applied immediately above the electrostatic correction lens. In addition, Japanese Unexamined Patent Application Publication No. 2019-212766 discloses a technique to extend a positive voltage-applied electrode of the electrostatic correction lens upstream to a position where the lens magnetic field decays. However, when these techniques are used, due to the presence of the additional electrode and the extended correction lens electrode, the deflector is inevitably disposed upstream away from the lens magnetic pole piece at a position where the magnetic field decays (in other words, in-lens arrangement is not possible), and a problem arises that it is difficult to achieve reduction in the array distortion caused by deflection.

As described above, in the past, in the multi-beam optical system, it has never been possible to achieve reduction in beam position variation due to electric charge of the deflectors with the secondary electrons, reduction in beam position variation due to stay of the secondary electrons, and reduction in multi-beam array distortion at the same time under the condition that the electrostatic lenses are operated in the positive voltage range to reduce the return of the secondary electrons to the substrate.

BRIEF DESCRIPTION OF THE DRAWINGS

FIG. 2 is a schematic view of a shaping aperture array substrate.

FIG. 3 is a cross-sectional view of a second objective lens.

FIGS. 6A, 6B, 6C, 6D are views each illustrating the position of a writing deflection region where the polarity of the deflection voltage is constant.

FIG. 7 is a view showing a configuration example of a positioning deflector.

FIGS. 8A, 8B are views each showing a configuration example of a positioning deflector.

FIGS. 9A, 9B, 9C are views for explaining the position of a writing deflection region where the polarity of the deflection voltage is constant.

FIGS. 10A, 10B are views for explaining the position of a writing deflection region where the polarity of the deflection voltage is constant.

FIG. 11 is a cross-sectional view of a second objective lens when a magnetic deflector is provided in the vicinity of an electrostatic positioning deflector.

FIGS. 12A, 12B are views for explaining a trajectory of a secondary electron.

FIG. 13 is a view for explaining a configuration of a positioning deflector and a voltage applied to each electrode.

FIG. 14 is a view for explaining a configuration of a positioning deflector and a voltage applied to each electrode.

DETAILED DESCRIPTION

In one embodiment, a multi charged particle beam writing method includes forming a multi charged particle beam with which a substrate serving as a writing target is irradiated, deflecting the multi charged particle beam to a position with a predetermined deflection offset added so that deflection voltages respectively applied to a plurality of electrodes of an electrostatic positioning deflector does not include a state where all the deflection voltages are zero, and irradiating the substrate with the multi charged particle beam. A positive common voltage is added to the deflection voltages which are applied to the respective electrodes of the electrostatic positioning deflector.

Hereinafter, an embodiment of the present invention will be described based on the drawings. In the present embodiment, a configuration will be described, which uses an electron beam as an example of a charged particle beam. However, the charged particle beam is not limited to an electron beam, and may be an ion beam or the like.

Figure 1:
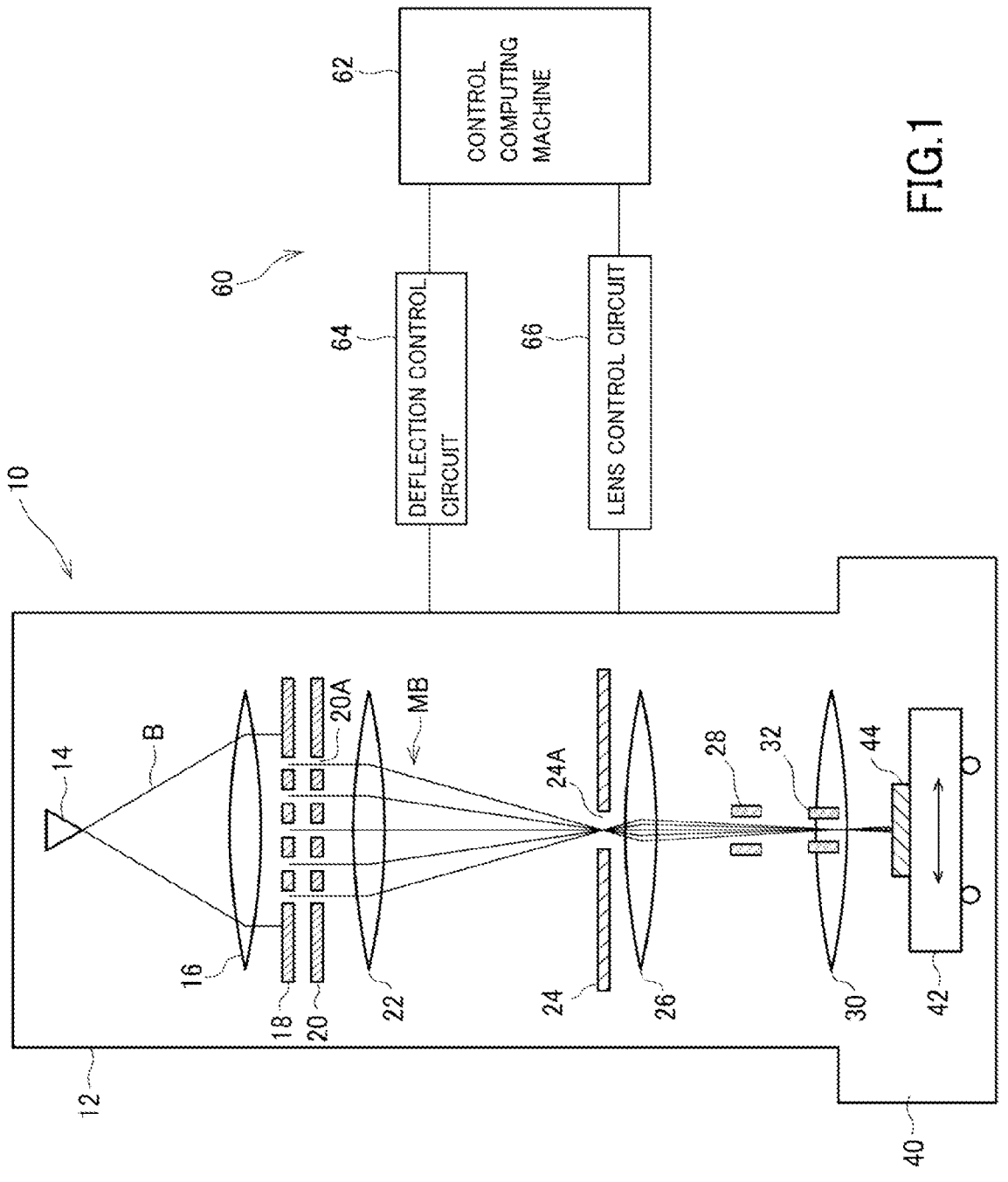
FIG. 1 is a schematic view of a multi charged particle beam writing apparatus according to an embodiment of the present invention.

A writing apparatus illustrated in FIG. 1 includes a writer 10 that irradiates an object such as a mask and a wafer with an electron beam to write a desired pattern; and a controller 60 that controls the operation of the writer 10. The writer 10 is an example of a multi-beam writing apparatus having an electron optical column 12 and a writing chamber 40.

In the electron optical column 12, an electron source (emitter) 14, an illuminating lens 16, a shaping aperture array substrate 18, a blanking aperture array substrate 20, a projection lens 22, a stopping aperture (limiting aperture member) 24, a first objective lens 26, a positioning deflector 28, a second objective lens 30, and a focus correction lens 32 are disposed. An XY stage 42 is disposed in the writing chamber 40. A mask blank which is a substrate 44 serving as a writing target is placed on the XY stage 42.

The substrate 44 includes, for example, a wafer and a mask for exposure to transfer a pattern to the wafer using a reduced projection exposure device, such as a stepper and a scanner, which uses an excimer laser as a light source, or an extreme ultraviolet ray exposure device. In addition, the substrate 44 also includes a mask in which a pattern has been already formed. For example, a Levenson-type mask requires writing twice, thus a second pattern may be written on a pattern once written and fabricated on a mask.

As illustrated in FIG. 2, in the shaping aperture array substrate 18, openings (first openings) 18A with m vertical rows×n horizontal rows (m, n≥2) are formed with a predetermined arrangement pitch. The openings 18A are formed as rectangles in the same dimensional shape. The shape of the openings 18A may be circular. A multi-beam MB is formed by parts of electron beam B respectively passing through the plurality of openings 18A.

The blanking aperture array substrate 20 is provided below the shaping aperture array substrate 18, and passage holes 20A (the second openings) corresponding to the openings 18A of the shaping aperture array substrate 18 are formed. In each of the passage holes 20A, a blanker (not illustrated) consisting of a set of two electrodes forming a pair is disposed. One of the blanker is fixed to the ground potential, and the other is switched between the ground potential and another potential. An electron beam passing through each passage hole 20A is independently deflected by a voltage applied to a corresponding blanker. In this manner, a plurality of blankers perform blanking deflection on corresponding beams of the multi-beam MB which has passed through the plurality of openings 18A of the shaping aperture array substrate 18.

A stopping aperture 24 shields the beam deflected by a blanker. A beam not deflected by a blanker passes through an opening 24A (a third opening) formed in the center of the stopping aperture 24. To reduce the leakage of beam at the time of individual blanking performed by the blanking aperture array substrate 20, the stopping aperture 24 is disposed on an imaging plane of a crossover (electron source image) where the beam expansion is small.

The controller 60 has a control computing machine 62, a deflection control circuit 64 and a lens control circuit 66. The deflection control circuit 64 controls the blankers provided in the blanking aperture array substrate 20, and the voltage applied to each electrode of the positioning deflector 28. The lens control circuit 66 controls the voltages applied to the illuminating lens 16, the projection lens 22, the first objective lens 26, the second objective lens 30, and the focus correction lens 32. For example, the lens control circuit 66 controls the voltage to be applied to the focus correction lens 32 based on the surface height of the substrate 44 detected by Z sensor (not illustrated), and performs focus correction (dynamic focus).

The electron beam B emitted from the electron source 14 illuminates the entire shaping aperture array substrate 18 substantially perpendicularly by the illuminating lens 16. The electron beam B passes through the plurality of openings 18A of the shaping aperture array substrate 18, thereby forming a multi-beam MB comprising a plurality of electron beams. The multi-beam MB passes through corresponding blankers of the blanking aperture array substrate 20.

The multi-beam MB which has passed through the blanking aperture array substrate 20 is reduced by the projection lens 22, and travels to the opening 24A in the center of the stopping aperture 24. Here, an electron beam deflected by a blanker of the blanking aperture array substrate 20 is displaced from the opening 24A of the stopping aperture 24, and is shielded by the stopping aperture 24. In contrast, an electron beam not deflected by a blanker passes through the opening 24A of the stopping aperture 24. Blanking control is performed by on/off of each blanker and on/off of the beam is controlled.

In this manner, the stopping aperture 24 shields the beam which is deflected by a blanker of the blanking aperture array substrate 20 to achieve a beam-off state.

The multi-beam MB which has passed through the stopping aperture 24 is focused by the first objective lens 26, the second objective lens 30, and the focus correction lens 32, then forms a pattern image with a desired reduction ratio, and the pattern image is radiated onto the substrate 44.

The positioning deflector 28 disposed between the first objective lens 26 and the second objective lens 30 deflects and radiates the multi-beam MB to a desired position in the substrate 44 placed on the XY stage 42 which moves continuously. The positioning deflector 28 has a plurality of electrodes, and for example, a quadrupole deflector having four electrodes or an octupole deflector having eight electrodes may be used. The beam deflection position (the beam irradiation position in the substrate 44) can be changed by altering the voltage applied to each electrode of the positioning deflector 28.

The dimensions of an area of the substrate 44 irradiated with the multi-beam MB is large as much as approximately 100 micrometers square, thus even when the dimensions of the region (writing deflection region) to be deflected by the positioning deflector 28 are smaller than the dimensions of the multi-beam MB, no problem occurs regarding the writing throughput. For example, an area approximately from several micrometers square to 10 micrometers square is sufficient. This is totally different from the variable shaping electron beam writing apparatus which requires a large writing deflection region of approximately 100 micrometers square to achieve a writing throughput.

The focus correction lens 32 is disposed downstream of the positioning deflector 28 with respect to the traveling direction of the multi-beam MB.

Although an electromagnetic lens (magnetic field lens) is used as each of the illuminating lens 16, the projection lens 22, the first objective lens 26 and the second objective lens 30, part or all of the lenses may be electrostatic lenses. The focus correction lens 32 makes dynamic focus adjustment to height variation of the surface of the substrate 44, and an electrostatic lens is used. However, an electromagnetic lens (including a coil that generates an axially symmetric magnetic field) may be used. Alternatively, the focus correction lens 32 may be comprised of a multi-stage lens system in which each applied voltage and each exciting current change in coordination with each other in a constant relationship. Alternatively, the second objective lens 30 may also have the function of the focus correction lens 32, or the second objective lens 30 and the focus correction lens 32 may be configured to make focus adjustment by working in coordination with each other in a constant relationship.

The second objective lens 30 is an electromagnetic lens, and has a coil 30a and a yoke 30b which stores the coil 30a as illustrated in FIG. 3. The yoke 30b is made of a material having high magnetic permeability, such as iron, and is provided with a notch (pole piece 30c).

The magnetic field lines generated by a current flowing through the coil 30a escape to space through the pole piece 30c, and a magnetic field is generated.

The focus correction lens 32 is arranged, for example, inside the second objective lens 30, for example, according to the height of the pole piece 30c. The focus correction lens 32 is an electrostatic lens, and has a ring-shaped electrode. A positive voltage with respect to the substrate surface is applied to the electrode, and the focus correction lens 32 is operated in a positive voltage range with respect to the substrate surface.

When the multi-beam MB (primary beam) is radiated to the substrate 44, secondary electrons are released from the substrate surface. The operation of the focus correction lens 32 in a positive voltage range causes the secondary electrons to be guided upward from the substrate surface, and to move upward in the electron optical column 12. It is possible to prevent the secondary electrons to return to the substrate surface, and to reduce positional variation due to electric charge of the resist.

In a writing process, the resist on the surface of the substrate 44 is evaporated due to beam irradiation, and contamination may adhere to the surfaces of the multiple electrodes of the positioning deflector 28. The secondary electrons moving upward within the electron optical column 12 reach and electrically charge the contamination on the electrode surfaces of the positioning deflector 28, and the trajectory of the multi-beam MB may be changed due to the charged contamination.

Figures 4A, 4B, 5:
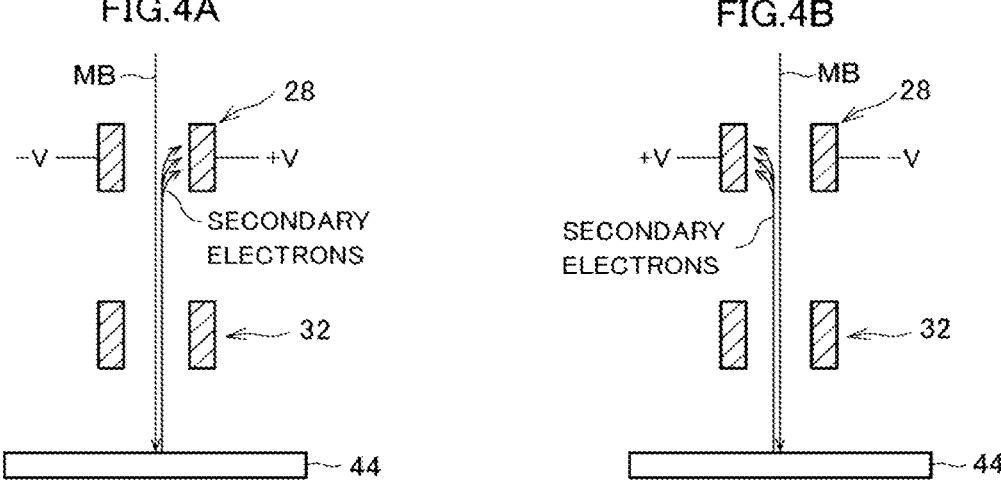
FIGS. 4A, 4B are views each illustrating a trajectory of a secondary electron in a comparative example.
FIG. 5 is a view for explaining a deflectable region and a writing deflection region.

In the writing apparatus of related art, in the operation of changing the beam deflection position (beam irradiation position in the substrate 44), as illustrated in FIG. 4A, FIG. 4B, the polarity of the deflection voltage applied to each electrode of the positioning deflector 28 has been changed. When the polarity of the deflection voltage is changed, the intensity and direction of the electric field in the positioning deflector 28 are greatly changed, and the reached position of the secondary electrons, in other words, the electric charge position is significantly changed across the electrode. Significant change in the electric charge position causes a substantial change in the electric field near the beam, and as a result, a large variation (drift) in the beam irradiation position occurs.

Thus, in the present embodiment, the operation of the positioning deflector 28 with an offset (deflection offset) added to the deflection position thereof, in other words, with the deflection position shifted causes the secondary electrons to be removed from the vicinity of the beam center, to be moved in a substantially constant transverse direction, and to be guided to reach a restricted area such as the deflector surface. For example, as illustrated in FIG. 5, writing deflection region R1 is shifted within deflectable region R0 so that the origin of the deflection voltage is not included in the writing deflection region R1, in other words, zero-state of the deflection voltage of all electrodes of the positioning deflector 28 (all deflection voltages are zero) is not included. Here, the deflectable region R0 is the region where deflection is possible within a maximum output of a deflection amplifier included in the deflection control circuit 64. The writing deflection region R1 is a deflection region that is needed for a writing process. As illustrated in FIG. 12A, FIG. 12B, excluding the origin of the deflection voltage from the writing deflection region R1 can reduce the change in the reached position of the secondary electrons, in other words, the change in the electric charge position for change in the deflection position, thus the beam irradiation position variation (drift) is reduced.

Furthermore, it is more effective if the deflection offset is set so that the polarity of the deflection voltage of each electrode (individual electrodes) of the positioning deflector 28 is constant and unchanged. In order to make the polarity of the deflection voltage of each electrode constant, in a quadrupole deflector, it is sufficient that the writing deflection region R1 be included in one of regions R11 to R14 illustrated in FIG. 6A to FIG. 6D. Consequently, the region of a deflection electrode, with which the secondary electrons collide is further restricted, thus the range of position where electric charge occurs is also further restricted. As a result, change in the intensity and direction of the electric field in the positioning deflector 28 is reduced, and the beam irradiation position variation (drift) is reduced, thereby improving the beam position accuracy.

Note that when "the deflection offset is set so that the polarity of the deflection voltage of each electrode is constant", "the state where all deflection voltages are zero is not included" is automatically (inevitably) satisfied. Therefore, "the polarity is constant" is more restricted condition than "the state where all deflection voltages are zero is not include".

Note that the condition related to the voltage applied to the deflector contributes to the drift reduction more directly. The beam deflection position and deflection region on the substrate surface are just shifted as a result, and the beam deflection position and deflection region themselves on the substrate surface do not necessarily directly contribute to the drift reduction.

Here, a desired position on the substrate 44 can be irradiated with a beam by applying a constant deflection offset always at the time of writing, and setting operating parameters so that the origin of deflection at the time of writing is at a position shifted by the deflection offset. Although the usable writing deflection region becomes smaller by the deflection offset, the multi-beam writing apparatus does not require a large writing deflection region, thus no practical problem arises. In addition, from the viewpoint of the drift reduction, it is most effective to make the deflection offset constant during a writing operation.

Note that as described above, in a range where the condition, "the deflection voltage does not include zero" or "the polarity is constant" is satisfied, the deflection offset may be slightly changed during a writing operation. In this case, the position of the XY stage 42 needs to be modified according to the amount of change in the deflection offset.

FIG. 7 illustrates an example of a configuration of the positioning deflector 28. In the example illustrated in FIG. 7, the positioning deflector 28 is an electrostatic quadrupole deflector having four electrodes 28a to 28d. Let $(X_0, Y_0)$ be the deflection offset, $(X, Y)$ be the amount of deflection for pattern writing based on the pattern position of writing data, and k be the deflection sensitivity coefficient, then the deflection voltages $V_1$ to $V_4$ to be applied to the electrodes 28a to 28d are as follows.

$$V_1 = k(X_0 + X)$$

$$V_2 = k(Y_0 + Y)$$

$$V_3 = k(-X_0 - X)$$

$$V_4 = k(-Y_0 - Y)$$

A case will be discussed where the deflectable region in the x direction is from $-X_M$ to $X_M$, the deflectable region in the y direction is from $-Y_M$ to $Y_M$, the writing deflection region in the x direction is from $-X_W$ to $X_W$, and the writing deflection region in the y direction is from $-Y_W$ to $Y_W$. As illustrated in FIG. 5, the deflection offset $(X_0, Y_0)$ should satisfy the conditional expressions below so that the origin of the deflection voltage is not included in the writing deflection region R1 and the polarity of the deflection voltage of each electrode of the positioning deflector 28 is constant.

$$X_W < |X_0| \le X_M - X_W$$

$$Y_W < |Y_0| \le Y_M - Y_W$$

The deflection offset $(X_0, Y_0)$ which satisfies the above conditional expressions is determined in advance, and stored in a memory (not illustrated) of the controller 60.

At the time of a writing process, the control computing machine 62 reads writing data from the memory device, and generates shot data specific to the apparatus by performing multi-stage data conversion process. The shot data defines the irradiation amount and irradiation position coordinates of each shot. The irradiation position coordinates are calculated using the above-mentioned deflection offset $(X_0, Y_0)$ as the origin of deflection.

The control computing machine 62 outputs the irradiation amount of each shot to the deflection control circuit 64 based on the shot data. The deflection control circuit 64 determines an irradiation time t by dividing an input irradiation amount by a current density. When making a corresponding shot, the deflection control circuit 64 applies a deflection voltage to a corresponding blanker of the blanking aperture array substrate 20 so as to achieve beam-ON of the blanker only for the irradiation time t.

The deflection control circuit 64 also determines an amount of deflection for writing $(X, Y)$ so that the irradiation position indicated by the shot data is irradiated with a beam, adds or subtracts the deflection offset $(X_0, Y_0)$ to or from $(X, Y)$, and multiplies by the deflection sensitivity coefficient k, and applies the products given by the above-stated deflection voltages $V_1$ to $V_4$ to the electrodes 28a to 28d of the positioning deflector 28. When the amount of deflection for writing is determined, position information on the XY stage 42 is obtained and utilized from a position measuring instrument (not illustrated) such as a laser length measuring device.

In this manner, the secondary electrons are guided to a restricted region of the positioning deflector 28 so that the polarity of the deflection voltage of each deflection electrode of the positioning deflector 28 is constant, and change in the deflector electric charge is reduced, thereby making it possible to stabilize the beam.

The positioning deflector 28 may use an octupole deflector having eight electrodes 28a to 28h as illustrated in FIG. 8A, FIG. 8B. The deflectors illustrated in FIG. 8A, FIG. 8B are different in installation angle by 22.5 degrees. In the present specification, the arrangement in which the deflection coordinate axes each pass through the center of a gap between deflection electrodes as in FIG. 8A is called 22.5-degree rotation arrangement, and the arrangement in which the deflection coordinate axes each pass through the center a deflection electrode as in FIG. 8B is called zero-degree rotation arrangement.

In the 22.5-degree rotation arrangement illustrated in FIG. 8A, the deflection voltages $V_1$ to $V_8$ applied to the electrodes 28a to 28h are expressed as follows using the deflection offset $(X_0, Y_0)$, the amount of deflection for writing $(X, Y)$, and the deflection sensitivity coefficient k.

$$V_1 = k\{(X_0 + X) + a(Y_0 + Y)\}$$
$$V_2 = k\{(Y_0 + Y) + a(X_0 + X)\}$$
$$V_3 = k\{(Y_0 + Y) - a(X_0 + X)\}$$
$$V_4 = k\{-(X_0 + X) + a(Y_0 + Y)\}$$
$$V_5 = k\{-(X_0 + X) - a(Y_0 + Y)\}$$
$$V_6 = k\{-(Y_0 + Y) - a(X_0 + X)\}$$
$$V_7 = k\{-(Y_0 + Y) + a(X_0 + X)\}$$
$$V_8 = k\{(X_0 + X) - a(Y_0 + Y)\}$$
$$a = \sqrt{2} - 1 \fallingdotseq 0.414$$

In order to make the polarity of the deflection voltage of each electrode of the positioning deflector 28 constant in the 22.5-degree rotation arrangement, it is sufficient that the writing deflection region be included in one of region Ra (Ra1 to Ra4) for 22.5 degrees to 67.5 degrees and subsequent every 90 degree illustrated in FIG. 9A, region Rb (Rb1, Rb2) for −22.5 degrees to 22.5 degrees and subsequent rotation of 180 degrees illustrated in FIG. 9B, and region Rc (Rc1, Rc2) for 67.5 degrees to 112.5 degrees, and subsequent rotation of 180 degrees illustrated in FIG. 9C.

In order to include the writing deflection region in the region Ra, it is sufficient that the deflection offset $(X_0, Y_0)$ satisfy the following conditional expressions.

$$|Y_0| + Y_W < (\sqrt{2} + 1)(|X_0| - X_W)$$
$$|Y_0| - Y_W > (\sqrt{2} - 1)(|X_0| + X_W)$$

-continued $$|X_0| \leq X_M - X_W$$
$$|Y_0| \leq Y_M - Y_W$$

In order to include the writing deflection region in the region Rb, it is sufficient that the deflection offset $(X_0, Y_0)$ satisfy the following conditional expressions.

$$|Y_0| + Y_W < (\sqrt{2} - 1)(|X_0| - X_W)$$
$$|Y_0| - Y_W > -(\sqrt{2} - 1)(|X_0| - X_W)$$
$$|X_0| \leq X_M - X_W$$
$$|Y_0| \leq Y_M - Y_W$$

In order to include the writing deflection region in the region Rc, it is sufficient that the deflection offset $(X_0, Y_0)$ satisfy the following conditional expressions.

$$|X_0| + X_W < (\sqrt{2} - 1)(|Y_0| - Y_W)$$
$$|X_0| - X_W > -(\sqrt{2} - 1)(|Y_0| - Y_W)$$
$$|X_0| \leq X_M - X_W$$
$$|Y_0| \leq Y_M - Y_W$$

In the zero-degree rotation arrangement illustrated in FIG. 8B, the deflection voltages $V_1$ to $V_8$ applied to the electrodes 28a to 28h are expressed as follows using the deflection offset $(X_0, Y_0)$, the amount of deflection for writing $(X, Y)$, and the deflection sensitivity coefficient k'.

$$V_1 = k'(X_0 + X)$$
$$V_2 = k'b\{(X_0 + X) + (Y_0 + Y)\}$$
$$V_3 = k'(Y_0 + Y)$$
$$V_4 = k'b\{-(X_0 + X) + (Y_0 + Y)\}$$
$$V_5 = -k'(X_0 + X)$$
$$V_6 = -k'b\{(X_0 + X) + (Y_0 + Y)\}$$
$$V_7 = -k'(Y_0 + Y)$$
$$V_8 = -k'b\{-(X_0 + X) + (Y_0 + Y)\}$$
$$b = 1/\sqrt{2} \fallingdotseq 0.707$$

In order to make the polarity of the deflection voltage of each electrode of the positioning deflector 28 constant in the zero-degree rotation arrangement, it is sufficient that the writing deflection region be included in one of region Rd (Rd1 to Rd4) for 0 degree to 45 degrees, and its symmetric images with respect to the x-axis, the y-axis, and the origin illustrated in FIG. 10A, and region Re (Re1 to Re4) for 45 degrees to 90 degrees, and its symmetric images with respect to the x-axis, the y-axis, and the origin illustrated in FIG. 10B.

In order to include the writing deflection region in the region Rd, it is sufficient that the deflection offset $(X_0, Y_0)$ satisfy the following conditional expressions.

$$|Y_0| + Y_W < |X_0| - X_W$$

$$|X_0| \leqq X_M - X_W$$

$$|Y_0| \leqq Y_M - Y_W$$

$$|Y_0| > Y_W$$

In order to include the writing deflection region in the region Re, it is sufficient that the deflection offset $(X_0, Y_0)$ satisfy the following conditional expressions.

$$|X_0| + X_W < |Y_0| - Y_W$$

$$|X_0| \leqq X_M - X_W$$

$$|Y_0| \leqq Y_M - Y_W$$

$$|X_0| > X_W$$

As illustrated in FIG. 13, when a positive common voltage Vc with respect to the substrate surface is added to the voltage applied to each electrode of the positioning deflector 28, drift can be reduced more reliably. It is preferable that the common voltage Vc has a value higher than or equal to the upper limit value of positive voltage VF applied to the focus correction lens 32. Consequently, the secondary electrons which have passed through the focus correction lens 32 move to the positioning deflector 28 without being decelerated, thus stay of the secondary electrons between the focus correction lens 32 and the positioning deflector 28 is prevented, and the beam irradiation position accuracy can be improved. Although the electrostatic deflector is arranged in the vicinity of the focus correction lens, because drift due to stay of the secondary electrons does not occur, the deflector can be arranged at a position where a lens magnetic field is present, and the array distortion caused by deflection can be reduced, and increase in the array distortion can be prevented even with a deflection offset applied. In addition, as in the example illustrated in FIG. 14, two-stage positioning deflectors are provided, one of the positioning deflectors 28 is disposed in the vicinity of the focus correction lens, and the amount of deflection and the direction of deflection of two positioning deflectors 28, 28' are optimized, thereby making it possible to further reduce the increase in the array distortion due to the deflection offset.

Note that in general, a ring-shaped ground electrode may be disposed between the voltage-applied electrodes of the electrostatic deflector and the focus correction lens. However, when the (voltage-applied) electrodes of both are arranged close to each other without disposing such a ground electrode, temporary deacceleration (deacceleration of the secondary electrons) also does not occur in a short interval near the ground electrode, thus drift due to the stay can be reduced further reliably.

For example, in the case of a positioning deflector comprised of the quadrupole deflector illustrated in FIG. 7, the voltages applied to the electrodes are as follows.

$$V_1 = Vc + k(X_0 + X)$$

$$V_2 = Vc + k(Y_0 + Y)$$

$$V_3 = Vc + k(-X_0 - X)$$

$$V_4 = Vc + k(-Y_0 - Y)$$

In the expressions above, the left-hand side is the voltage applied to each electrode, the first term (Vc) of the right-hand side is the common voltage, and the second term (the term multiplied by k) of the right-hand side is the deflection voltage already described. Note that in the present specification, the "voltage applied" and "deflection voltage" to the deflector are distinguished from each other. The "voltage applied" is the voltage applied to each electrode, and is the sum of the common voltage and the deflection voltage. The "deflection voltage" is the voltage which contributes to generation of a deflection electric field, and the deflection voltage causes the incident beam and the secondary electrons to be deflected. Note that when a common voltage is not applied, the "voltage applied" and "deflection voltage" to the deflector are the same.

As illustrated in FIG. 11, a magnetic deflector 29 may be provided in the vicinity of the electrostatic positioning deflector 28. Part or all of the deflection offset of an incident beam (multi-beam MB) on the substrate surface can be cancelled to further reduce the distortion and aberration of the incident beam by exciting the magnetic deflector 29 so as to generate a deflection offset opposite to the deflection offset of the positioning deflector 28. The amount of excitation of the magnetic deflector 29 may be set according to the deflection offset of the positioning deflector 28, and does not need to be changed in coordination with the operation of deflection positioning. Alternatively, after the deflection offset of the positioning deflector 28 is cancelled, part of the amount of excitation may be changed in coordination with the operation of deflection positioning. When the magnetic deflector 29 cancels all the deflection offset of the positioning deflector 28, the center of the writing deflection region (R1 of FIG. 5) on the substrate surface is zero, and no offset of the deflection position occurs practically, and as described above, the deflection position and deflection region themselves on the substrate surface do not necessarily directly contribute to the drift reduction. In other words, the effect of drift reduction is obtained by satisfying the above-described conditions related to the deflection voltages. Note that in the magnetic field deflection, the deflection direction is reversed according to the moving direction of a beam, thus the secondary electrons moving in the opposite direction to the incident beam are not inhibited from being deflected.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing method comprising:

forming a multi charged particle beam with which a substrate serving as a writing target is irradiated;

deflecting the multi charged particle beam to a position with a predetermined deflection offset added so that deflection voltages respectively applied to a plurality of electrodes of an electrostatic positioning deflector do not include a state where all the deflection voltages are zero and origins of the deflection voltages are not included in writing deflection regions, each of the writing deflection regions being shifted within a corresponding deflectable region deflectable regions such that the origins of the deflection voltages are not included in the writing deflection regions, and the deflection offset being constant during a writing operation; and irradiating an entirety of the substrate with the multi charged particle beam during the writing operation, wherein a positive common voltage is added to the deflection voltages which are applied to the respective electrodes of the electrostatic positioning deflector.

2. The method according to claim 1, further comprising deflecting the multi charged particle beam to the position with the predetermined deflection offset added so that polarities of the deflection voltages of the plurality of electrodes of the electrostatic positioning deflector are respectively constant.

3. The method according to claim 1, wherein a focus correction lens is operated in a positive voltage range, the focus correction lens being disposed downstream of the positioning deflector in a traveling direction of the multi charged particle beam.

4. The method according to claim 3, wherein the common voltage has a value higher than or equal to an upper limit value of positive voltage applied to the focus correction lens.

5. The method according to claim 1, wherein a magnetic deflector is used to cause deflection in a direction opposite to the deflection offset.

6. A multi charged particle beam writing apparatus comprising:

an electrostatic positioning deflector including a plurality of electrodes and deflecting a multi charged particle beam with which a substrate serving as a writing target is irradiated; and a deflection control circuit performing deflection control on the multi charged particle beam at a position with a predetermined deflection offset added so that deflection voltages respectively applied to the plurality of electrodes do not include a state where all the deflection voltages are zero and origins of the deflection voltages are not included in writing deflection regions, each of the writing deflection regions being shifted within a corresponding deflectable region deflectable regions such that the origins of the deflection voltages are not included in the writing deflection regions, and the deflection offset being constant during a writing operation, wherein an entirety of the substrate is irradiated with the multi charged particle beam during the writing operation, and wherein a positive common voltage is added to the deflection voltages which are applied to the plurality of electrodes of the electrostatic positioning deflector respectively.

7. The apparatus according to claim 6, wherein the deflection control circuit performs deflection control on the multi charged particle beam at the position with the predetermined deflection offset added so that polarities of the deflection voltages of the plurality of electrodes are respectively constant.

8. The apparatus according to claim 6, further comprising:

a focus correction lens disposed downstream of the positioning deflector in a traveling direction of the multi charged particle beam; and a lens control circuit causing the focus correction lens to operate in a positive voltage range.

9. The apparatus according to claim 8, wherein the common voltage has a value higher than or equal to an upper limit value of positive voltage applied to the focus correction lens.

10. The apparatus according to claim 6, further comprising a magnetic deflector causing deflection in a direction opposite to the deflection offset.

11. The apparatus according to claim 6, wherein the positioning deflector consists of a two-stage deflector.

12. The apparatus according to claim 6, wherein the deflectable regions correspond to regions where deflection is possible within a maximum output of a deflection amplifier included in the deflection control circuit.

* * * * *